United States Patent
Jung et al.

(10) Patent No.: US 8,344,312 B2
(45) Date of Patent: Jan. 1, 2013

(54) COLOR FILTER ARRAY HAVING PLURAL FILTER LAYERS, IMAGE SENSOR INCLUDING THE SAME, AND ELECTRONIC DEVICE INCLUDING THE COLOR FILTER ARRAY

(75) Inventors: Tae Sub Jung, Anyang-si (KR); Bum Suk Kim, Hwasung-si (KR); Jung Chak Ahn, Yongin-si (KR); Jin Hak Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 343 days.

(21) Appl. No.: 12/805,109

(22) Filed: Jul. 13, 2010

(65) Prior Publication Data
US 2011/0012011 A1    Jan. 20, 2011

(30) Foreign Application Priority Data
Jul. 15, 2009  (KR) .......................... 10-2009-0064372

(51) Int. Cl.
*G01J 3/50* (2006.01)

(52) U.S. Cl. ..................................... 250/226; 250/208.1

(58) Field of Classification Search .................. 250/226, 250/208.1, 239, 216; 257/440, 448; 348/279, 348/220.1, 237, 280; 345/4, 9, 87
See application file for complete search history.

(56) References Cited

U.S. PATENT DOCUMENTS
7,858,921 B2 * 12/2010 Stanton et al. ................ 250/226

FOREIGN PATENT DOCUMENTS
| JP | 2004-304706 | 10/2004 |
| JP | 2007-104178 | 4/2007 |
| JP | 2007-288395 | 11/2007 |
| KR | 10-2005-0067908 | 7/2005 |

* cited by examiner

*Primary Examiner* — Que T Le
(74) *Attorney, Agent, or Firm* — Harness, Dickey & Pierce (57) ABSTRACT

A color filter array is provided. The color filter array includes a plurality of basic filter blocks arranged in all directions. Each of the basic filter blocks include one or more color filters. The color filters include a first type color filter that passes through all light without filtering it or has a higher light transmittance than a second type color filter, a third type color filter, and a fourth type color filter. The second through fourth color filters being a red, green or blue filter. Accordingly, the color filter array increases sensitivity to incident light or increases brightness of outgoing light.

19 Claims, 10 Drawing Sheets

| G | W | B | W |
|---|---|---|---|
| W | G | W | B |
| R | W | G | W |
| W | R | W | G |

FIRST LAYER
SECOND LAYER
THIRD LAYER
FOURTH LAYER

COLOR FILTER ARRAY HAVING PLURAL FILTER LAYERS, IMAGE SENSOR INCLUDING THE SAME, AND ELECTRONIC DEVICE INCLUDING THE COLOR FILTER ARRAY

CROSS-REFERENCE TO RELATED APPLICATIONS

This application claims priority under 35 U.S.C. §119(e) to Korean Patent Application No. 10-2009-0064372 filed on Jul. 15, 2009, in the Korean Intellectual Property Office, the disclosure of which is incorporated herein by reference.

BACKGROUND

Example embodiments relate to optical technology, and more particularly, to a color filter array for selectively filtering incoming or outgoing light, an image sensor including the same, and an electronic device including the color filter array.

Example embodiments relate to a color filter array including color filters which filter light in a particular range. The color filter array is used to filter incoming light to receive light in a particular range or filter outgoing light to emit light in a particular range.

A representative use of color filters filtering incoming light to receive light in a particular range is a color filter included in image sensors. A conventional color filter array included in image sensors includes a plurality of red color filters, a plurality of green color filters, and a plurality of blue color filters to allow through only red, green, and blue which are three primary colors of light. Each of the red, the green, and the blue color filters passes through only about ⅓ of all incoming light, and therefore, an image sensor receives ⅓ of the incident light, which decreases the sensitivity of the image sensor.

A representative use of color filters filtering outgoing light to emit light in a particular range is a color filter included in liquid crystal displays (LCDs). Because a color filter array included in an LCD also includes a plurality of red, green, and blue color filters to pass through only red, green, and blue light in outgoing light, ⅓ of all outgoing light is emitted from the LCD, which decreases the brightness of the LCD.

SUMMARY

Example embodiments provide a color filter array for increasing sensitivity to incident light, an image sensor including the same, and an electronic device including the color filter array.

Example embodiments also provide a color filter array for increasing brightness of emitted light and an electronic device including the same.

According to example embodiments, there is provided a color filter array. the color filter array includes a plurality of basic filter blocks. Each of the basic filter blocks include a plurality of layers. A first layer includes one or more first type color filters, and one or more other type color filters which are arranged sequentially. A second layer includes one of (1) one or more of the first type color filters and one or more of the other type color filters which are arranged sequentially and (2) one or more of the other type color filters which are arranged sequentially. A third layer including one or more of the first type color filters and one or more of the other type color filters which are arranged sequentially. A fourth layer including one of (1) one or more of the first type color filters and one or more of the other type color filters which are arranged sequentially and (2) one or more of the other type color filters which are arranged sequentially. The first type color filters have a higher light transmittance than the other type color filters.

According to example embodiments, there is provided a color filter array including a plurality of 4×4 basic filter blocks arranged in all direction. Each of the basic filter blocks includes a first layer including a first type color filter, a second type color filter, a first type color filter, and a third type color filter which are arranged sequentially.

A second layer includes a second type color filter, a fourth type color filter, a third type color filter, and a fourth type color filter which are arranged sequentially. A third layer includes a first type color filter, a third type color filter, a first type color filter, and a second type color filter which are arranged sequentially. A fourth layer includes a third type color filter, a fourth type color filter, a second type color filter, and a fourth type color filter which are arranged sequentially.

The first type color filters have a higher light transmittance than the second through fourth type color filters. The first type color filters and fourth type color filters are alternately arranged along a first diagonal line of each basic filter block and the third type color filters are arranged on a second diagonal line of the basic filter block.

According to example embodiments, there is provided a color filter array including a plurality of 4×4 basic filter blocks arranged in all direction. Each of the basic filter blocks includes a first layer including a first type color filter, a second type color filter, a first type color filter, and a third type color filter which are arranged sequentially. A second layer includes a fourth type color filter, a first type color filter, a third type color filter, and a first type color filter which are arranged sequentially. A third layer includes a first type color filter, a third type color filter, a first type color filter, and a fourth type color filter which are arranged sequentially. A fourth layer includes a third type color filter, a first type color filter, a second type color filter, and a first type color filter which are arranged sequentially.

The first type color filters have a higher light transmittance than the second through fourth type color filters. The first type color filters are arranged on a first diagonal line of each basic filter block and the third type color filters are arranged on a second diagonal line of the basic filter block.

According to example embodiments, there is provided a color filter array including a plurality of 4×4 basic filter blocks arranged in all direction. Each of the basic filter blocks includes a first layer including a first type color filter, a second type color filter, a first type color filter, and a third type color filter which are arranged sequentially. A second layer includes a fourth type color filter, a first type color filter, a third type color filter, and a first type color filter which are arranged sequentially. A third layer includes a first type color filter, a third type color filter, a first type color filter, and a second type color filter which are arranged sequentially. A fourth layer includes a third type color filter, a first type color filter, a fourth type color filter, and a first type color filter which are arranged sequentially.

The first type color filters have a higher light transmittance than the second through fourth type color filters. The first type color filters are arranged on a first diagonal line of each basic filter block and the third type color filters are arranged on a second diagonal line of the basic filter block.

According to example embodiments, there is provided a color filter array including a plurality of 4×4 basic filter blocks arranged in all direction. Each of the basic filter blocks includes a first layer including a first type color filter, a second type color filter, a third type color filter, and a second type color filter which are arranged sequentially. A second layer includes a second type color filter, a first type color filter, a second type color filter, and a third type color filter which are arranged sequentially. A third layer includes a fourth type color filter, a second type color filter, a first type color filter, and a second type color filter which are arranged sequentially. A fourth layer includes a second type color filter, a fourth type color filter, a second type color filter, and a first type color filter which are arranged sequentially.

The second type color filters have a higher light transmittance than the first, third and fourth type color filters. The first type color filters are arranged on a first diagonal line of each basic filter block and the third type color filters are arranged on a second diagonal line of the basic filter block.

According to example embodiments, there is provided a color filter array including a plurality of 2×4 basic filter blocks arranged in all direction. Each of the basic filter blocks includes a first layer including a first type color filter and a second type color filter. A second layer includes a third type color filter and a fourth type color filter. A third layer includes a second type color filter and a first type color filter. A fourth layer including a third type color filter and a fourth type color filter. The first type color filters have a higher light transmittance than the second through fourth type color filters.

According to example embodiments, there is provided an image sensor including at least one of the above-described color filter arrays.

According to example embodiments, there is provided an electronic device including at least one of the above-described color filter arrays.

BRIEF DESCRIPTION OF THE DRAWINGS

Example embodiments will be more clearly understood from the following brief description taken in conjunction with the accompanying drawings. FIGS. 1-10 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments will be described more fully hereinafter with reference to the accompanying drawings, in which example embodiments are shown. Example embodiments may, however, be embodied in many different forms and should not be construed as limited to the example embodiments set forth herein. Rather, these example embodiments are provided so this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
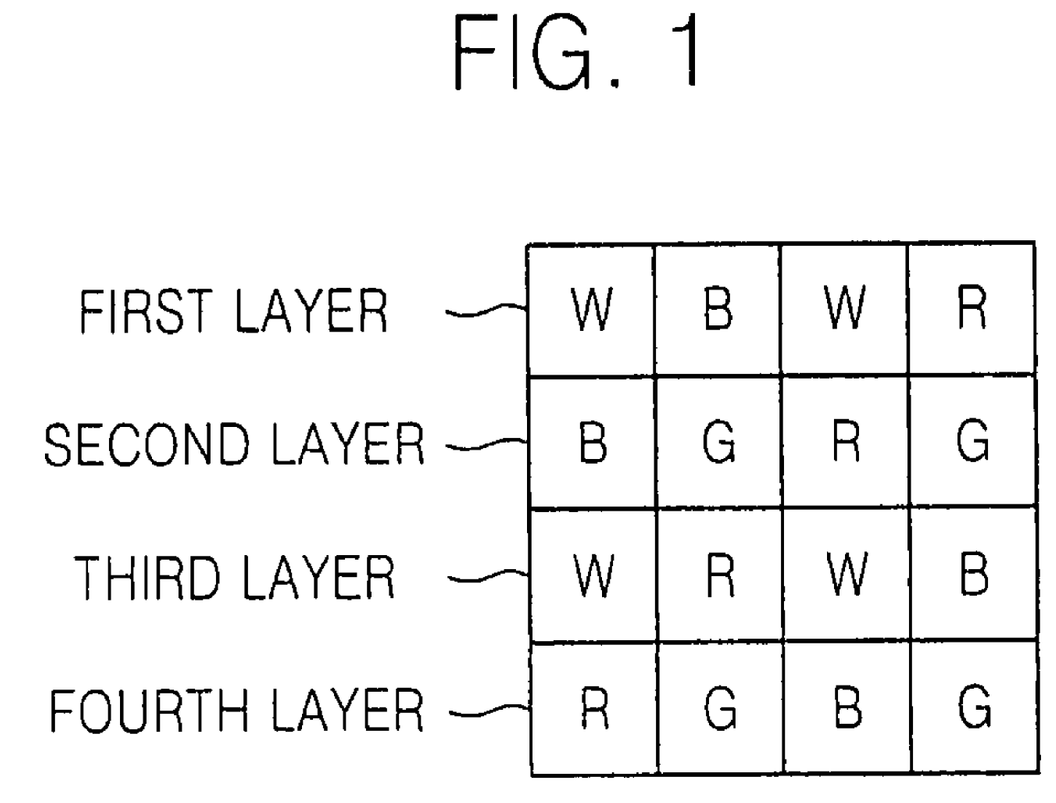
FIG. 1 is a diagram of a basic filter block of a color filter array according to example embodiments.

FIG. 1 is a diagram of a basic filter block of a color filter array according to example embodiments. Although not shown, the color filter array may include a plurality of 4×4 basic filter blocks arranged in all directions around the basic filter block shown in FIG. 1. Referring to FIG. 1, the basic filter block includes first through fourth layers.

The first layer may include a first type color filter W, a second type color filter B, a first type color filter W, and a third type color filter R which may be sequentially arranged horizontally. The second layer may include a second type color filter B, a fourth type color filter G, a third type color filter R, and a fourth type color filter G which may be sequentially arranged horizontally.

The third layer may include a first type color filter W, a third type color filter R, a first type color filter W, and a second type color filter B which may be sequentially arranged horizontally. The fourth layer may include a third type color filter R, a fourth type color filter G, a second type color filter B, and a fourth type color filter G which may be sequentially arranged horizontally. The first type color filters W may have a higher light transmittance than the second through fourth type color filters B, R, and G.

The first type color filters W may be white color filters. The second type color filters B may be blue color filters. The third type color filters R may be red color filters. The fourth type color filters G may be green color filters. A quarter of the color filter array may be occupied by first type color filters W, e.g, white color filters. The white color filters W may not filter light and pass through all light. The blue color filters B may filter incident light to pass through blue spectrum light. The red color filters R may pass through red spectrum light. The green color filters G may pass through green spectrum light. The white color filters W may be implemented by a transparent membrane such as an oxide layer, but example embodiments are not limited thereto.

Although the second, the third, and the fourth type color filters B, R, and G are illustrated as blue, red, and green color filters, respectively, in FIG. 1, example embodiments are not limited thereto. In addition, the first type color filters W are illustrated as white color filters in FIG. 1, but example embodiments are not limited thereto. For example, a first type color filter may be implemented by a color filter having a higher light transmittance than the blue, the red, and the green color filters B, R, and G.

A conventional color filter array including blue, red, and green color filters B, R, and G only without a white color filter W has satisfactory color reproducibility but has low sensitivity to light because the conventional color filter array passes only ⅓ of incident light. However, a color filter array including the basic filter block illustrated in FIG. 1 includes the white color filters W having a high light transmittance and thus may have a relatively higher photosensitivity than the conventional color filter array.

For example, if a color filter array including the basic filter block illustrated in FIG. 1 is used to filter light incident to an image sensor including, for example, a photodiode, the image sensor may have a relatively higher photosensitivity than an image sensor including a color filter array including red, green, and blue color filters R, G, and B only. If the color filter array including the basic filter block illustrated in FIG. 1 is used to filter light going out from a liquid crystal display (LCD), the LCD may realize a relatively higher brightness than an LCD including a color filter array including red, green, and blue color filters R, G, and B only.

Figure 2:
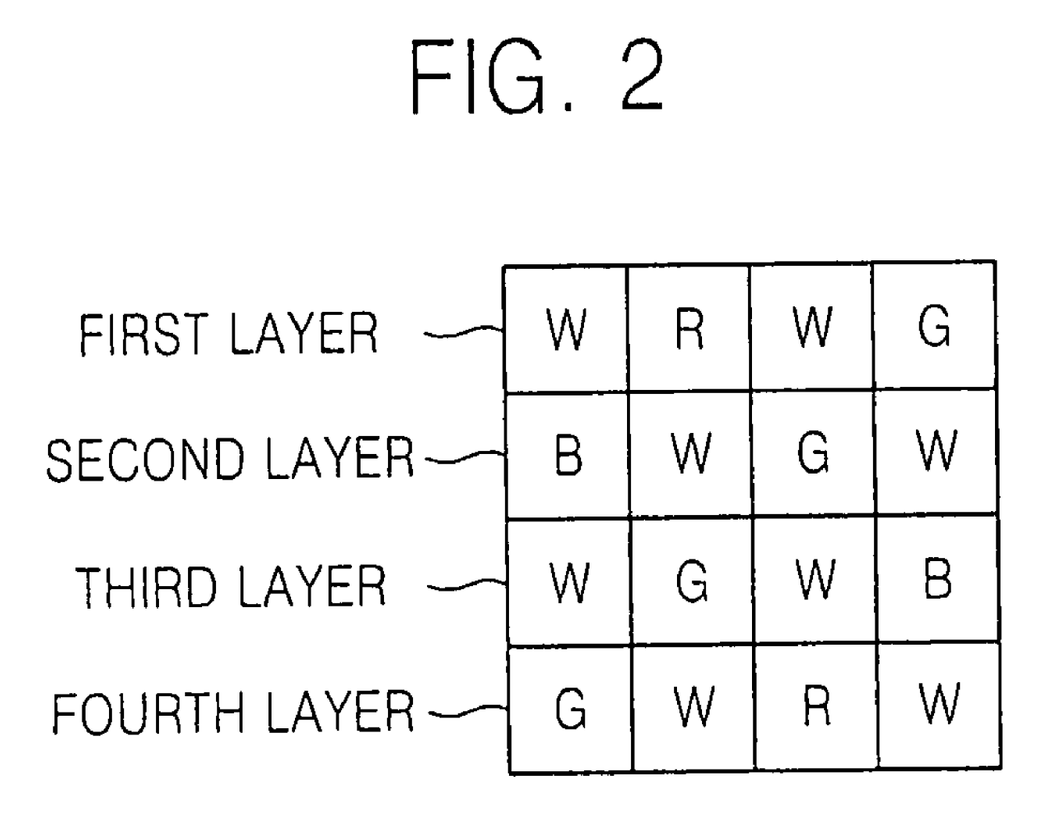
FIG. 2 is a diagram of a basic filter block of a color filter array according to example embodiments.

FIG. 2 is a diagram of a basic filter block of a color filter array according to example embodiments. Although not shown, the color filter array may include a plurality of 4×4 basic filter blocks arranged in all directions around the basic filter block shown in FIG. 2. Referring to FIG. 2, the basic filter block includes first through fourth layers.

The first layer may include a first type color filter W, a second type color filter R, a first type color filter W, and a third type color filter G which may be sequentially arranged horizontally. The second layer may include a fourth type color filter B, a first type color filter W, a third type color filter G, and a first type color filter W which may be sequentially arranged horizontally.

The third layer may include a first type color filter W, a third type color filter G, a first type color filter W, and a fourth type color filter B which may be sequentially arranged horizontally. The fourth layer may include a third type color filter G, a first type color filter W, a second type color filter R, and a first type color filter W which may be sequentially arranged horizontally. The first type color filters W may have a higher light transmittance than the second through fourth type color filters R, G, and B.

Referring to FIG. 2, the first type color filters W may be white color filters; the second type color filters R may be red color filters; the third type color filters G may be green color filters; and the fourth type color filters B may be blue color filters, but example embodiments are not limited thereto.

A half of a color filter array including the basic filter block shown in FIG. 2 may be occupied by first type color filters W, e.g., white color filters. Accordingly, the basic filter block illustrated in FIG. 2 may have a relatively higher photosensitivity as compared to the basic filter block illustrated in FIG. 1.

The white color filters W may be implemented by a transparent membrane, for example an oxide layer. Although the first type color filters W are illustrated as white color filters in FIG. 2, example embodiments are not limited thereto. For example, a first type color filter may be implemented by a color filter having a higher light transmittance than the blue, the red, and the green color filters B, R, and G.

Figure 3:
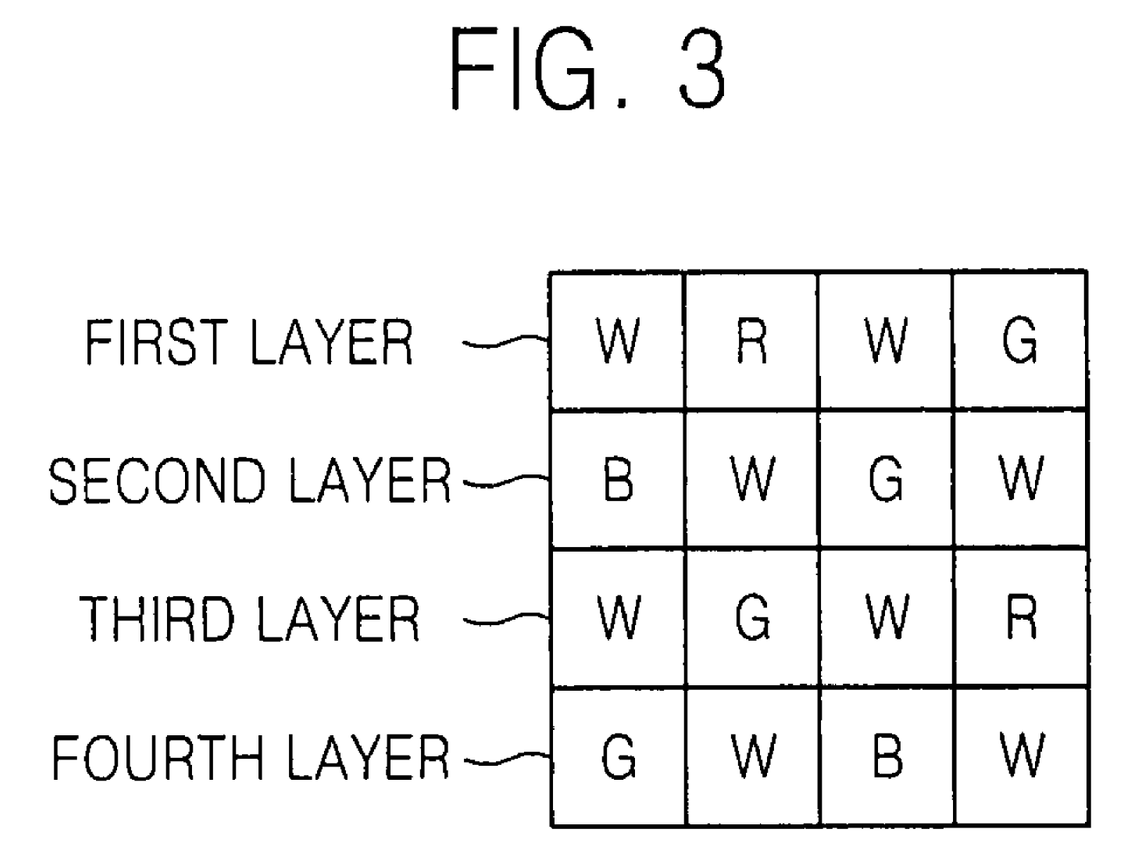
FIG. 3 is a diagram of a basic filter block of a color filter array according to example embodiments.

FIG. 3 is a diagram of a basic filter block of a color filter array according to example embodiments. Although not shown, the color filter array may include a plurality of 4×4 basic filter blocks arranged in all directions around the basic filter block shown in FIG. 3. Referring to FIG. 3, the basic filter block includes first through fourth layers.

The first layer may include a first type color filter W, a second type color filter R, a first type color filter W, and a third type color filter G which may be sequentially arranged horizontally. The second layer may include a fourth type color filter B, a first type color filter W, a third type color filter G, and a first type color filter W which may be sequentially arranged horizontally.

The third layer may include a first type color filter W, a third type color filter G, a first type color filter W, and a second type color filter R which may be sequentially arranged horizontally. The fourth layer may include a third type color filter G, a first type color filter W, a fourth type color filter B, and a first type color filter W which may be sequentially arranged horizontally. The first type color filters W may have a higher light transmittance than the second through fourth type color filters R, G, and B.

Referring to FIG. 3, the first type color filters W may be white color filters; the second type color filters R may be red color filters; the third type color filters G may be green color filters; and the fourth type color filters B may be blue color filters, but example embodiments are not limited thereto.

A half of a color filter array including the basic filter block shown in FIG. 3 may be occupied by first type color filters W, e.g., white color filters. Accordingly, the basic filter block illustrated in FIG. 3 may have a relatively higher photosensitivity as compared to the basic filter block illustrated in FIG. 1.

The white color filters W may be implemented by a transparent membrane, for example an oxide layer. Although the first type color filters W are illustrated as white color filters in FIG. 3, example embodiments are not limited thereto. For example, a first type color filter may be implemented by a color filter having a relatively higher light transmittance than the blue, the red, and the green color filters B, R, and G.

Figure 4:
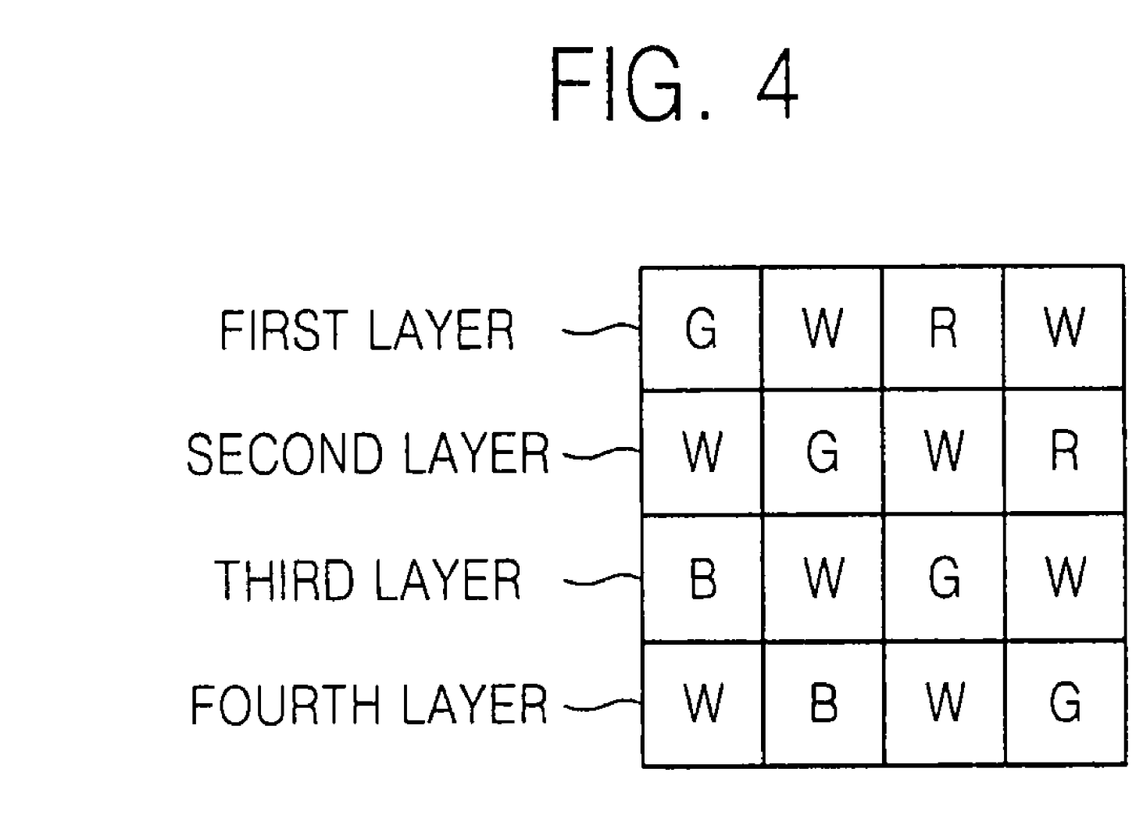
FIG. 4 is a diagram of a basic filter block of a color filter array according to example embodiments.

FIG. 4 is a diagram of a basic filter block of a color filter array according to example embodiments. Although not shown, the color filter array may include a plurality of 4×4 basic filter blocks arranged in all direction around the basic filter block shown in FIG. 4. Referring to FIG. 4, the basic filter block includes first through fourth layers.

The first layer may include a first type color filter G, a second type color filter W, a third type color filter R, and a second type color filter W which may be sequentially arranged horizontally. The second layer may include a second type color filter W, a first type color filter G, a second type color filter W, and a third type color filter R which may be sequentially arranged horizontally.

The third layer may include a fourth type color filter B, a second type color filter W, a first type color filter G, and a second type color filter W which may be sequentially arranged horizontally. The fourth layer may include a second type color filter W, a fourth type color filter B, a second type color filter W, and a first type color filter G which may be sequentially arranged horizontally. The second type color filters W may have a relatively higher light transmittance than the first, the third, and the fourth type color filters G, R, and B.

Referring to FIG. 4, the first type color filters G may be green color filters; the second type color filters W may be white color filters; the third type color filters R may be red color filters; and the fourth type color filters B may be blue color filters, but example embodiments are not limited thereto.

A half of a color filter array including the basic filter block shown in FIG. 4 may be occupied by second type color filters W, e.g., white color filters. Accordingly, the basic filter block illustrated in FIG. 4 may have a relatively higher photosensitivity as compared to the basic filter block illustrated in FIG. 1.

The white color filters W may be implemented by a transparent membrane, for example an oxide layer. Although the second type color filters W are illustrated as white color filters in FIG. 4, example embodiments are not limited thereto. For example, a second type color filter may be implemented by a color filter having a higher light transmittance than the blue, the red, and the green color filters B, R, and G.

Figure 5:
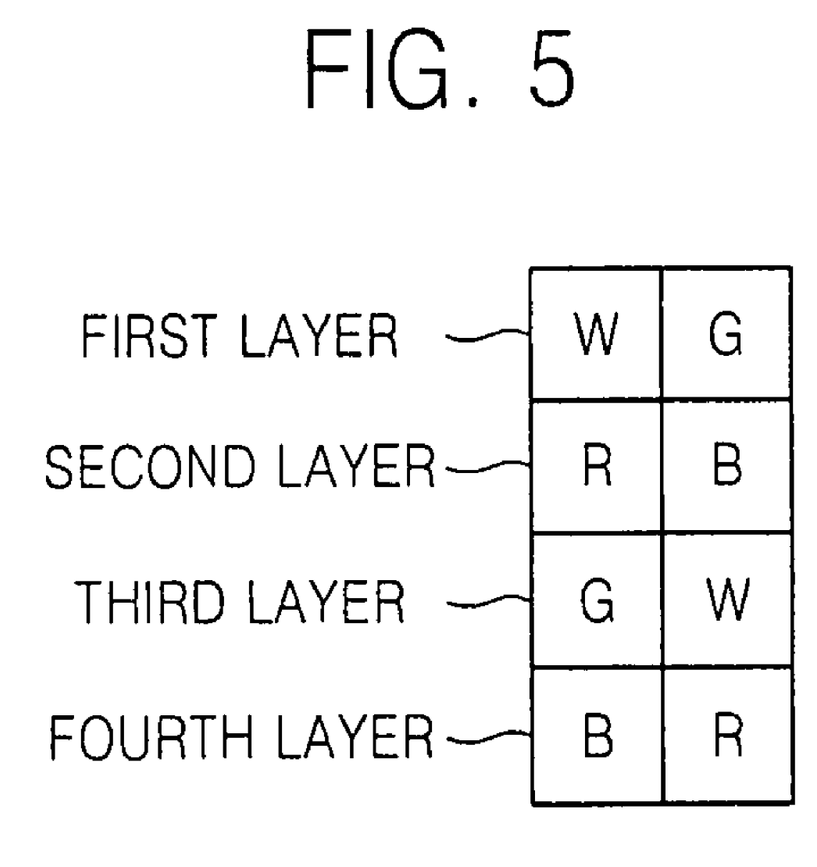
FIG. 5 is a diagram of a basic filter block of a color filter array according to example embodiments.

FIG. 5 is a diagram of a basic filter block of a color filter array according to example embodiments. Although not shown, the color filter array may include a plurality of 2×4 basic filter blocks arranged in all direction around the basic filter block shown in FIG. 5. Referring to FIG. 5, the basic filter block includes first through fourth layers.

The first layer may include a first type color filter W and a second type color filter G which may be sequentially arranged horizontally. The second layer may include a third type color filter R and a fourth type color filter B which may be sequentially arranged horizontally. The third layer may include a second type color filter G and a first type color filter W which may be sequentially arranged horizontally. The fourth layer may include a fourth type color filter B and a third type color filter R which may be sequentially arranged horizontally. The first type color filters W may have a higher light transmittance than the second through fourth type color filters G, R, and B.

Referring to FIG. 5, the first type color filters W may be white color filters; the second type color filters G may be green color filters; the third type color filters R may be red color filters; and the fourth type color filters B may be blue color filters, but example embodiments are not limited thereto.

A quarter of a color filter array including the basic filter block shown in FIG. 5 may be occupied by first type color filters W, e.g., white color filters. Accordingly, the color filter array including the basic filter block illustrated in FIG. 5 may have a relatively higher photosensitivity as compared to a conventional color filter array including only blue, red, and green color filters B, R, and G.

The white color filters W may be implemented by a transparent membrane, for example an oxide layer. Although the first type color filters W are illustrated as white color filters in FIG. 5, example embodiments are not limited thereto. For example, a first type color filter may be implemented by a color filter having a relatively higher light transmittance as compared to the blue, the red, and the green color filters B, R, and G.

Figure 6:
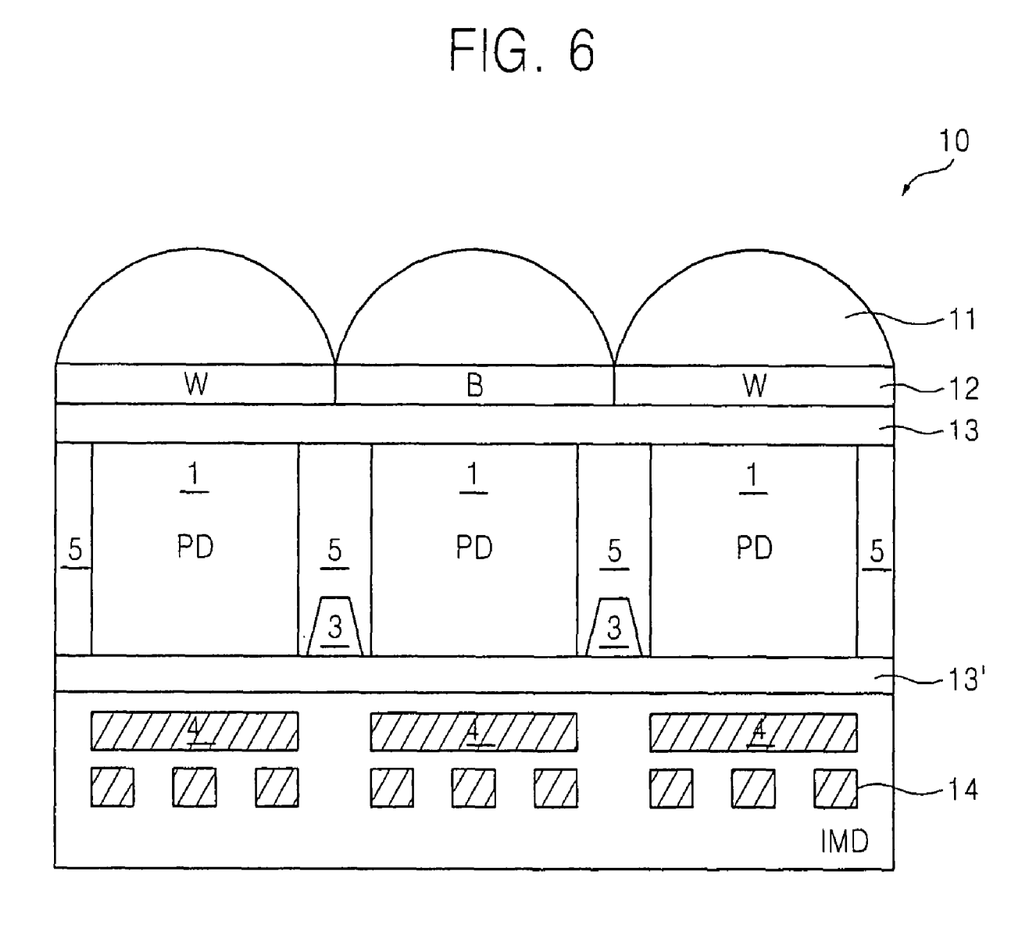
FIG. 6 is a cross-sectional view of a pixel array of an image sensor according to example embodiments.

FIG. 6 is a cross-sectional view of a pixel array 10 of an image sensor according to example embodiments. The image sensor including the pixel array 10 illustrated in FIG. 6 may be a back-side illumination (BSI) image sensor in which light reflecting metal layers 4 and interconnection metal lines 14 are arranged below photodiodes (PDs) 1, but example embodiments are not limited thereto.

Referring to FIG. 6, the pixel array 10 may include a plurality of the PDs 1, a plurality of oxide layers 3, a plurality of the metal layers 4, a plurality of wells 5, a plurality of lenses 11, a color filter array 12, a first P-type layer 13, a second P-type layer 13', and a plurality of the metal lines 14.

If each of the lenses 11 collects light toward a corresponding one of the PDs 1, the color filter array 12 may filter the light input through the lens 11. The color filter array 12 may be a color filter array that includes the basic filter block illustrated in one of FIGS. 1 through 5. Accordingly, the image sensor including the pixel array 10 illustrated in FIG. 6 may have a relatively higher photosensitivity as compared to a conventional image sensor including a color filter array including only blue, red, and green color filters B, R, and G without white color filters W.

The first P-type layer 13 may suppress dark current caused by electrons generated at the top surface of the PDs 1. The PDs 1 may be between the first P-type layer 13 and the second P-type layer 13'. The slope of potential barrier amongst the first P-type layer 13, the PDs 1, and the second P-type layer 13' and the slope of potential barrier between the PDs 1 and the second P-type layer 13' may be controlled by the concentration of the second P-type layer 13'. For example, as the concentration of the second P-type layer 13' increases, the slope of the potential barrier between the PDs 1 and the second P-type layer 13' may also increase.

The PDs 1 may generate photoelectrons in response to light incident from an outside source through the lenses 11. The wells 5 may insulate the PDs 1 from each another. The PDs 1 may be N-type semiconductors and the wells 5 may be P-type semiconductors. The wells 5 having relatively higher potential barrier as compared to the PDs 1 may prevent electrons generated at the PDs 1 from crossing over to adjacent PDs 1.

The oxide layers 3 at the bottom of the wells 5 may be formed using a shallow trench isolation (STI) process. The STI process is obvious to those of ordinary skill in the art, so detailed descriptions thereof will be omitted. In an inter-metal dielectric (IMD) area are the metal lines 14 providing the electric wiring necessary for the operation of the pixel array 10 and the metal layers 4 reflecting light passing through the PDs 1 back to the PDs 1.

Figure 7:
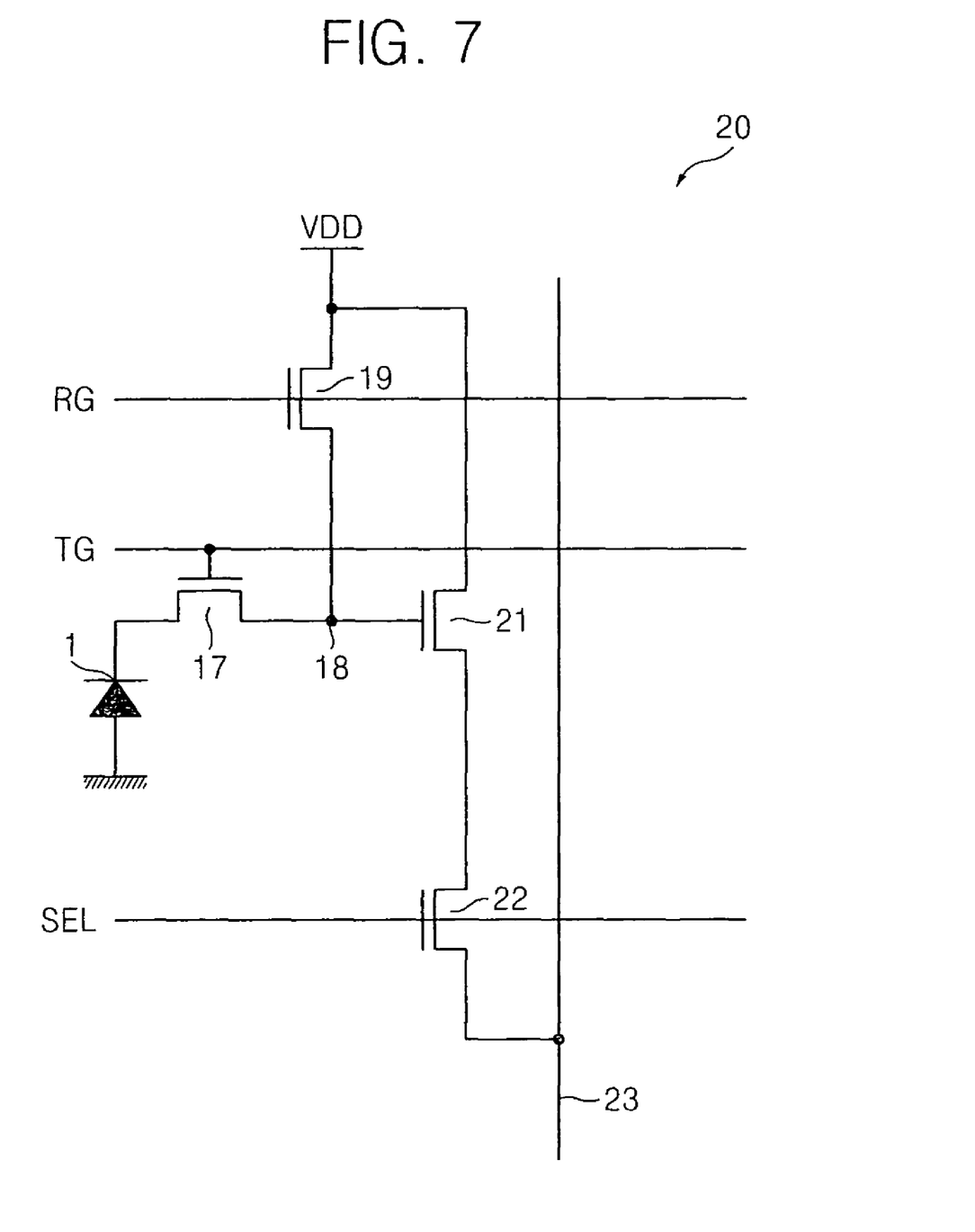
FIG. 7 is a circuit diagram of a unit pixel included in an image sensor according to example embodiments.

FIG. 7 is a circuit diagram of a unit pixel 20 included in an image sensor according to example embodiments. The unit pixel 20 illustrated in FIG. 7 is a four-transistor (4T) pixel. The circuit diagram illustrated in FIG. 7 is provided to briefly explain the operation of a unit pixel included in an image sensor, therefore a color filter included in the image sensor is not illustrated in FIG. 7. Referring to FIG. 7, the unit pixel 20 may include a PD 1, a floating diffusion area 18, and a plurality of transistors 17, 19, 21, and 22.

The PD 1 may generate photoelectrons in response to incident light. The transfer transistor 17 may transfer the photoelectrons from the PD 1 to the floating diffusion area 18 in response to a transfer signal TG. The reset transistor 19 may reset the floating diffusion area 18 to a voltage VDD in response to a reset signal RG. The drive transistor 21 may output a variable voltage via a vertical signal line 23 in response to a voltage level of the floating diffusion area 18. The select transistor 22 may selective output a pixel signal of the unit pixel 20 in response to a selection signal SEL.

Figure 8:
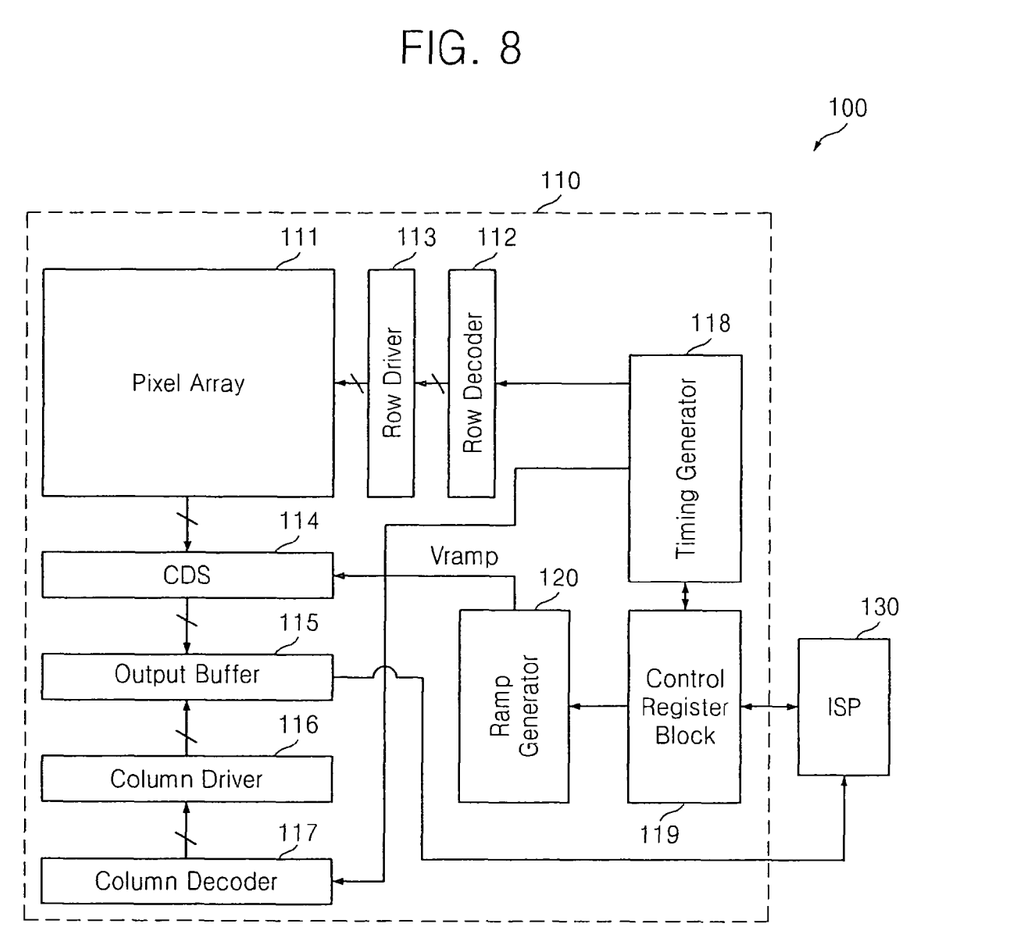
FIG. 8 is a block diagram of an image sensor according to example embodiments.

FIG. 8 is a block diagram of an image sensor 100 according to example embodiments. Referring to FIG. 8, the image sensor 100 may include a photoelectric converter 110 and an image signal processor (ISP) 130. The photoelectric converter 110 and the ISP 130 may be implemented in separate chips or modules.

The photoelectric converter 110 may generate an image signal corresponding to a photographed object based on incident light. The photoelectric converter 110 may include a pixel array 111, a row decoder 112, a row driver 113, a correlated double sampling (CDS) block 114, an output buffer 115, a column driver 116, a column decoder 117, a timing generator TG 118, a control register block 119, and a ramp generator 120.

The pixel array 111 may include a plurality of pixels connected to a plurality of row lines (not shown) and a plurality of column lines (not shown) in a two-dimensional matrix. Each of the pixels may include a red pixel converting red spectrum light into an electrical signal, a green pixel converting green spectrum light into an electrical signal, and a blue pixel converting blue spectrum light into an electrical signal. In addition, above the pixels included in the pixel array 111 may be disposed a color filter array which includes color filters each passing through particular color spectrum light as illustrated in FIGS. 1 through 5. Accordingly, the pixel array 111 may have a relatively higher photosensitivity as compared to a pixel array including a conventional color filter array including only red, green, and blue color filters R, G, and B. Therefore, the image sensor 100 may have a relatively higher photosensitivity as compared to a conventional image sensor.

The row decoder 112 may decode a row control signal (e.g., an address signal) generated by the timing generator 118. The row driver 113 may select a row line from among the plurality of row lines included in the pixel array 111 in response to the decoded row control signal.

The CDS block 114 may perform CDS on a pixel signal output from a unit pixel connected to one of the plurality of column lines included in the pixel array 111. The output buffer 115 may buffer and outputs signals output from the CDS block 114 in response to a column control signal (e.g., an address signal) output from the column driver 116.

The column driver 116 may selectively activate at least one of the column lines included in the pixel array 111 in response to a decoded column control signal (e.g., an address signal) output from the column decoder 117. The column decoder 117 may decode a column control signal (e.g., an address signal) generated by the timing generator 118. The timing generator 118 may generate at least one control signal for controlling the operation of at least one pixel among the pixel array 111, the row decoder 112, the output buffer 115, the column decoder 117, and the ramp generator 120 based on a command output from the control register block 119.

The control register block 119 may generate a variety of commands for controlling the elements of the photoelectric converter 110. The ramp generator 120 may output a ramp signal Vramp to the CDS block 114 in response to a command generated by the control register block 119. The ISP 130 may generate an image corresponding to a photographed object based on pixel signals output from the photoelectric converter 110.

As described above with reference to FIGS. 6 through 8, if a color filter array including the basic filter block illustrated in one of FIGS. 1 through 5 is used to filter incident light in an image sensor, the photosensitivity of the image sensor may be increased. However, the application of the color filter array including a basic filter block according to example embodiments are not limited to the example embodiments illustrated in FIGS. 6 through 8. A color filter array according to example embodiments may be used in diverse electronic systems for increasing sensitivity to incident light.

Figure 9:
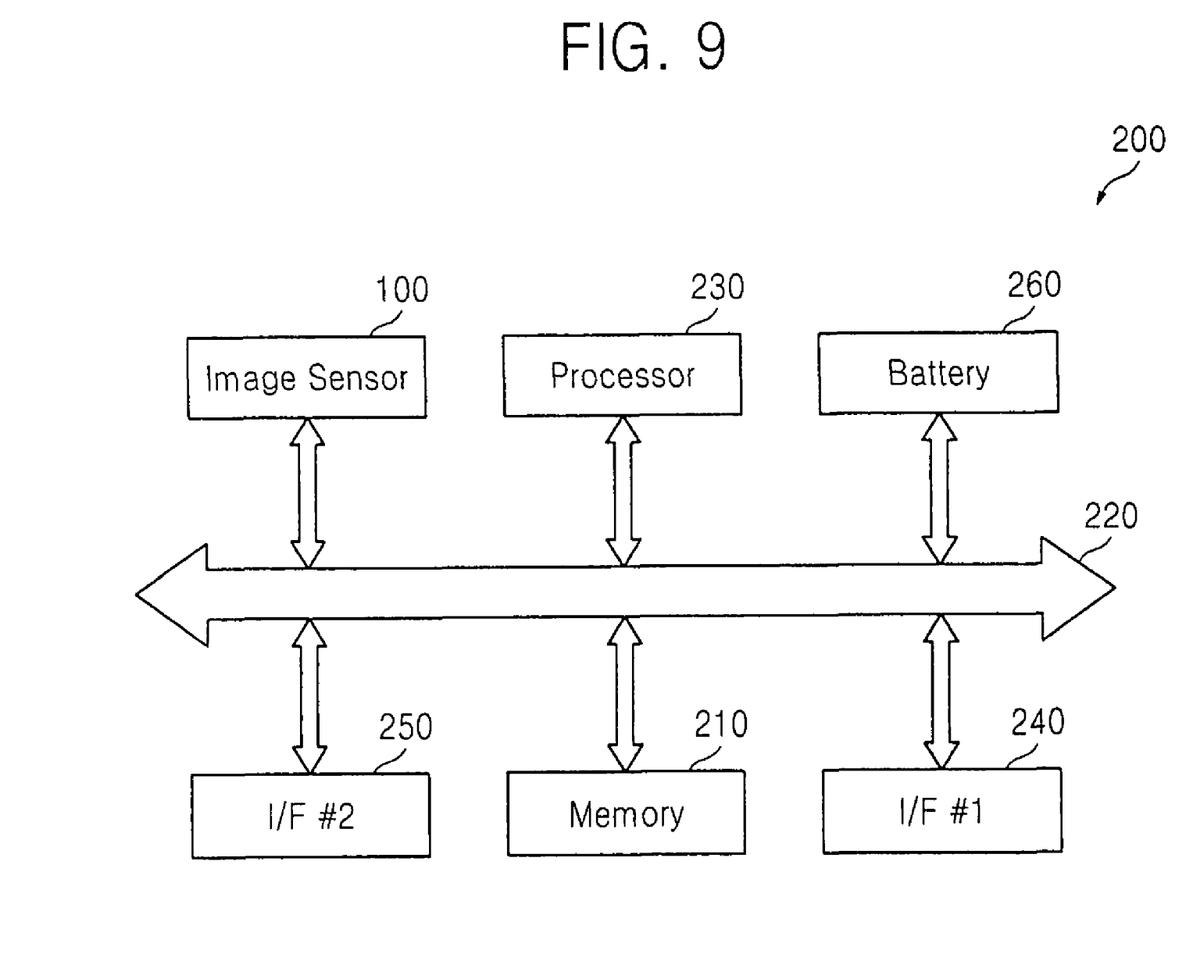
FIG. 9 is a block diagram of an electronic system including an image sensor according to example embodiments.

FIG. 9 is a block diagram of an electronic system 200 including an image sensor according to example embodiments. Referring to FIG. 9, the electronic system 200 may include the image sensor 100, a memory device 210, and a processor 230, which are connected to a system bus 220. The image sensor 100 may include a color filter array according to example embodiments, which may have a relatively higher photosensitivity as compared to a conventional color filter array.

The electronic system 200 may be a digital camera, a mobile phone, a smart phone, PDA, PMP performing camera function, respectively, but example embodiments are not limited thereto. The electronic system 200 may further include interfacing units 240 and 250 and a battery 260.

Figure 10:
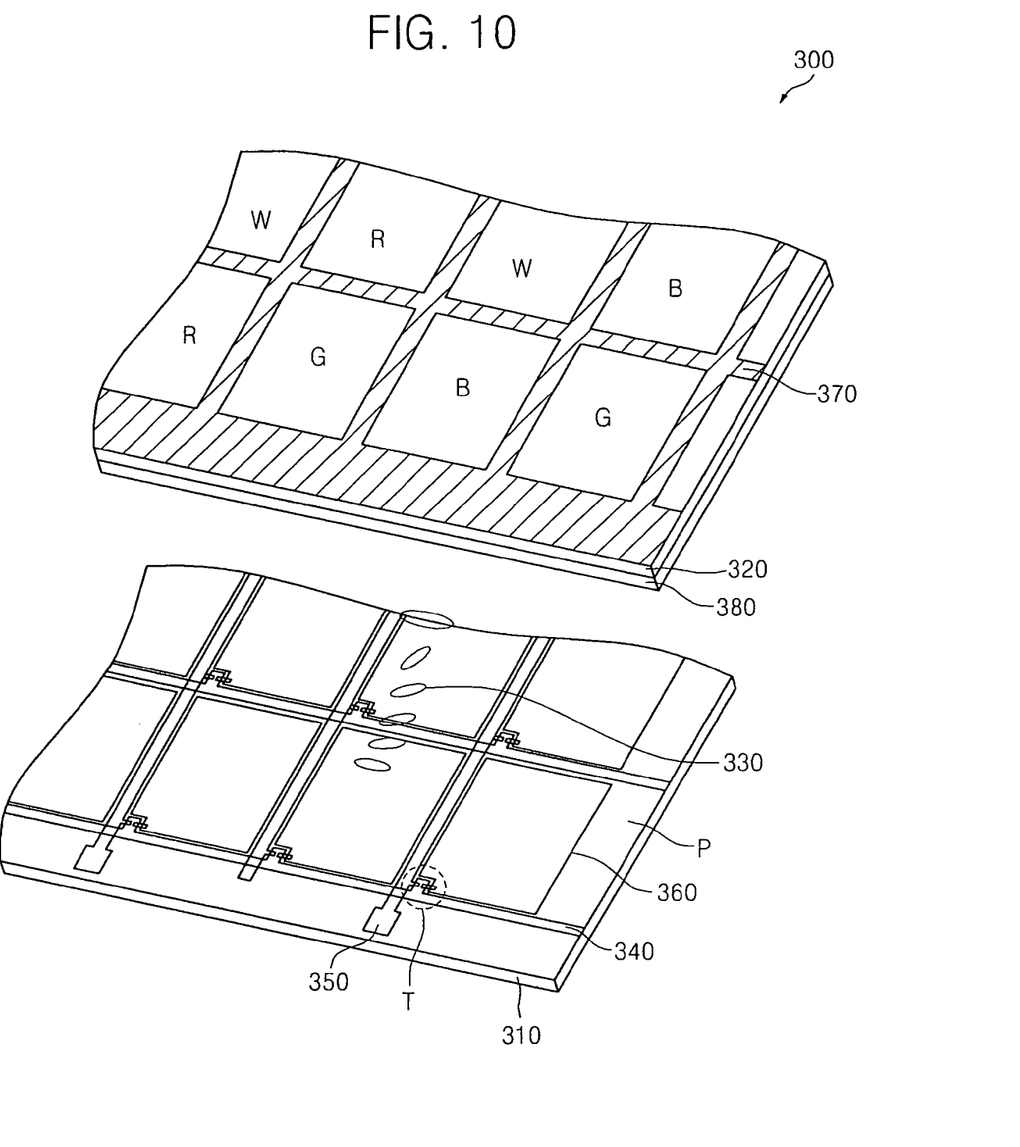
FIG. 10 is a diagram of the structure of a liquid crystal display (LCD) according to example embodiments.

FIG. 10 is a diagram of the structure of a liquid crystal display (LCD) 300 according to example embodiments. Referring to FIG. 10, the LCD 300 may include a lower substrate 310 and an upper substrate 320 which may be sealed to each other with a spacing therebetween and a liquid crystal layer 330 injected between the lower substrate 310 and the upper substrate 320.

A plurality of gate lines 340 may be arranged on the lower substrate 310 with a gap to define pixel areas P. A plurality of data lines 350 may be arranged on the lower substrate 310 with a gap in a direction perpendicular to the gate lines 340. A pixel electrode 360 may be between a gate line 340 and a data line 350 in a pixel area P and a thin-film transistor T may be at an intersection between the gate line 340 and the data line 350.

On the upper substrate 320 may be a black matrix layer 370 blocking light except incident light corresponding the pixel areas P, a color filter array including a white color filter W, a red color filter R, a green color filter G, and a blue color filter B, and a common electrode 380 for displaying an image. The color filter array may be a color filter array including the basic filter block illustrated one of FIGS. 1 through 5. The color filter array may have a relatively higher transmittance of light emitted through liquid crystals as compared to a conventional color filter array including only the red, green, and blue color filters R, G, and B. Therefore, the LCD 300 may provide higher brightness as compared to a conventional LCD including a color filter array including only the red, green, and blue color filters R, G, and B.

Referring to FIG. 10, a color filter array may include the basic filter block illustrated in one of FIGS. 1 through 5 which may be used to filter outgoing light in the LCD 300, but the example embodiments are not limited thereto. For example, a color filter array including the basic filter block illustrated in one of FIGS. 1 through 5 may be used in diverse electronic systems for increasing transmittance of outgoing light.

As described above, according to example embodiments, a color filter array and an image sensor and electronic device, which include the color filter array, may include a color filter that passes through all light without filtering it or has a higher light transmittance than basic color filters in addition to the basic color filters, thereby increasing sensitivity to incident light or increasing brightness of outgoing light.

While example embodiments have been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A color filter array comprising:
    a plurality of basic filter blocks, each of the basic filter blocks including,
        a first layer including one or more first type color filters, and one or more other type color filters which are arranged sequentially,
        a second layer including one of (1) one or more of the first type color filters and one or more of the other type color filters which are arranged sequentially and (2) one or more of the other type color filters which are arranged sequentially,
        a third layer including one or more of the first type color filters and one or more of the other type color filters which are arranged sequentially, and
        a fourth layer including one of (1) one or more of the first type color filters and one or more of the other type color filters which are arranged sequentially and (2) one or more of the other type color filters which are arranged sequentially,
        wherein the first type color filters have a higher light transmittance than the other type color filters.

2. The color filter array of claim 1, wherein the other type color filters include at least one of one or more second type color filters, one or more third type color filters and one or more fourth type color filters.

3. The color filter array of claim 2, wherein
    the first layer and the third layer include one first type color filter and one second type color filter, and
    the second layer and the fourth layer include one third type color filter and one fourth type color filter.

4. The color filter array of claim 2, wherein
    the first layer includes two first type color filters, one third type color filter and one fourth type color filter,
    the second layer includes two second type color filters, one third type color filter and one fourth type color filter,
    the third layer includes two first type color filters, one third type color filter and one fourth type color filter, and
    the fourth layer includes two second type color filters, one third type color filter and one fourth type color filter arranged in a different order than the second layer.

5. The color filter array of claim 2, wherein the first type color filters and the second type color filters are alternately arranged along a first diagonal line of each basic filter block and the third type color filters are arranged on a second diagonal line of each basic filter block.

6. The color filter array of claim 2, wherein
    the first layer and the fourth layer include two first type color filters, one second type color filter and one third type color filter, and
    the second layer and the third layer include two first type color filters, one fourth type color filter and one second type color filter.

7. The color filter array of claim 6, wherein the first type color filters are arranged on a first diagonal line of each basic filter block and the second type color filters are arranged on a second diagonal line of each basic filter block.

8. The color filter array of claim 2, wherein
    the first layer and the third layer include two first type color filters, one second type color filter and one third type color filter, and
    the second layer and the fourth layer include two first type color filters, one fourth type color filter and one second type color filter.

9. The color filter array of claim 8, wherein the first type color filters are arranged on a first diagonal line of each basic filter block and the second type color filters are arranged on a second diagonal line of each basic filter block.

10. The color filter array of claim 2, wherein
    the first layer and the second layer include two first type color filters, one second type color filter and one third type color filter, and
    the third layer and the fourth layer include two first type color filters, one fourth type color filter and one second type color filter.

11. The color filter array of claim 10, wherein the first type color filters are arranged on a first diagonal line of each basic filter block and the second type color filters are arranged on a second diagonal line of each basic filter block.

12. The color filter array of claim 2, wherein the first type color filters are white filters, the second type color filters are green filters, the third type color filters are red filters, and the fourth type color filters are blue filters.

13. The color filter array of claim 2, wherein the first type color filters are white filters, the second type color filters are blue filters, the third type color filters are red filters, and the fourth type color filters are green filters.

14. The color filter array of claim 2, wherein the first type color filters are white filters, the second type color filters are green filters, the third type color filters are blue filters, and the fourth type color filters are red filters.

15. The color filter array of claim 2, wherein the first type color filters are white filters, the second type color filters are red filters, the third type color filters are green filters, and the fourth type color filters are blue filters.

16. An image sensor comprising:
a color filter array including,
- a plurality of basic filter blocks, each of the basic filter blocks including,
- a first layer including one or more first type color filters, and one or more other type color filters which are arranged sequentially,
- a second layer including one of (1) one or more of the first type color filters and one or more of the other type color filters which are arranged sequentially and (2) one or more of the other type color filters which are arranged sequentially,
- a third layer including one or more of the first type color filters and one or more of the other type color filters which are arranged sequentially, and
- a fourth layer including one of (1) one or more of the first type color filters and one or more of the other type color filters which are arranged sequentially and (2) one or more of the other type color filters which are arranged sequentially, wherein the first type color filters have a higher light transmittance than the other type color filters.

17. The image sensor of claim 16, wherein
the other type color filters include one or more second type color filters, one or more third type color filters and one or more fourth type color filters,
the first type color filters are arranged on a first diagonal line of each basic filter block, and
one of the second type color filters, the third type color filters and the fourth type color filters are arranged on a second diagonal line of each basic filter block.

18. An electronic device comprising:
a color filter array including,
- a plurality of basic filter blocks, each of the basic filter blocks including,
- a first layer including one or more first type color filters, and one or more other type color filters which are arranged sequentially,
- a second layer including one of (1) one or more of the first type color filters and one or more of the other type color filters which are arranged sequentially and (2) one or more of the other type color filters which are arranged sequentially,
- a third layer including one or more of the first type color filters and one or more of the other type color filters which are arranged sequentially, and
- a fourth layer including one of (1) one or more of the first type color filters and one or more of the other type color filters which are arranged sequentially and (2) one or more of the other type color filters which are arranged sequentially, wherein the first type color filters have a higher light transmittance than the other type color filters.

19. The image sensor of claim 18, wherein
the other type color filters include one or more second type color filters, one or more third type color filters and one or more fourth type color filters,
the first type color filters are arranged on a first diagonal line of each basic filter block, and
one of the second type color filters, the third type color filters and the fourth type color filters are arranged on a second diagonal line of each basic filter block.

* * * * *